United States Patent [19]
Marvin et al.

[11] Patent Number: 5,180,942
[45] Date of Patent: Jan. 19, 1993

[54] THERMALLY ISOLATED OVENIZED CRYSTAL OSCILLATOR

[75] Inventors: Dennis F. Marvin, Roselle; Maria Hernandez-Solis, Elgin, both of Ill.

[73] Assignee: Motorola, Inc., Schaumburg, Ill.

[21] Appl. No.: 835,792

[22] Filed: Feb. 14, 1992

[51] Int. Cl.$^5$ ............................................. H01L 41/08
[52] U.S. Cl. ..................................... 310/346; 310/343
[58] Field of Search ......................... 174/252; 165/135; 310/89, 343, 346, 348; 331/69, 70; 361/383

[56] References Cited

U.S. PATENT DOCUMENTS

| | | | |
|---|---|---|---|
| 4,157,466 | 6/1979 | Herrin | 310/343 |
| 4,719,384 | 1/1988 | Hauden et al. | 310/343 |
| 4,985,687 | 1/1991 | Long | 310/343 |
| 5,039,878 | 8/1991 | Armstrong et al. | 323/907 |

*Primary Examiner*—Steven L. Stephan
*Assistant Examiner*—Matthew Nguyen
*Attorney, Agent, or Firm*—Joseph P. Krause

[57] ABSTRACT

Heat-generating ovenized crystal oscillators can be directly mounted to a circuit board. Thermal isolation of an OCO from heat-sinking circuit board material and other temperature-sensitive components on a circuit board is accomplished by means of perforations (12) in the circuit board that surround the mounting area of the OCO on the board.

4 Claims, 1 Drawing Sheet

THERMALLY ISOLATED OVENIZED CRYSTAL OSCILLATOR

FIELD OF THE INVENTION

This invention relates to piezoelectric devices. More particularly, this invention relates to ovenized crystal oscillators (OCOs).

BACKGROUND OF THE INVENTION

Ovenized crystal oscillators are well known in the art. These devices typically comprise a piezoelectric device such as a quartz crystal, the frequency-temperature characteristics of which are well known. The piezoelectric device is typically enclosed in an oven-like structure that is heated by some means so as to elevate the temperature of the piezoelectric device to a predetermined temperature at which its resonant frequency is most stable.

For optimum frequency stability, the piezoelectric device in an OCO is kept in a relatively narrow range of temperatures at which the output frequency of the piezoelectric device is stable. A temperature sensing mechanism is frequently used in a closed loop feedback system to control the amount of heat input to the oven in order to keep the temperature and hence the frequency of the piezoelectric device stable over time.

For many quartz crystals, the temperature at which the quartz must be kept, to have its frequency be stable is relatively high. A so called SC-cut crystal has a very stable output frequency near 80 degrees centigrade, a temperature at which the resonant frequency of the crystal is extremely stable. Unfortunately, consistently maintaining such a high temperature in a OCO used in a modern radio, for example, uses large amounts of power and has a long temperature settling time (the time it takes for the temperature inside the oven to stabilize). Additionally other temperature-sensitive semiconductor components located close by the oven might require thermal isolation from the oven to protect them from the heat transfered from the OCO that can adversely their performance.

In the past, thermally isolating an OCO by physically separating the OCO and its associated circuitry from large, heat-sinking circuit boards has reduced the temperature settling time and reduced the power required to raise and keep the oven at a high temperature. In addition, such a physical separation, accomplished by using either stand-offs, or by otherwise relocating the OCO away from temperature-sensitive devices has help to thermally isolate temperature-sensitive components from a high-temperature oven.

Mounting an OCO on its own circuit board, which is then typically mounted on standoffs that are connected to a main circuit board creates problems in the manufacture and assembly of both such boards, in addition to creating problems interconnecting the signals to and from the OCO board, to other circuits on the main circuit board. Accordingly a solution to the thermal isolation of a OCO on a circuit board would be an improvement over the prior art.

SUMMARY OF THE INVENTION

There is disclosed a temperature controlled ovenized crystal oscillator for mounting to a single printed circuit board. The OCO avoids the problems of heat transfer associated with prior art OCO's by locating the OCO in an area of the circuit board to which it is mounted, that is substantially enclosed by perforations through the circuit board. The perforations reduce heat sink effect of a large circuit board, reducing the power required to maintain a high temperature and reducing the temperature stabilization time. The perforations also reduce transfer from the OCO to other devices on the board.

The OCO comprises a piezoelectric device, of course, which is enclosed in a chamber, or enclosure, in which the piezoelectric device is located. Additional active and/or passive components that might comprise an oscillator circuit, such as inductors, resistors, capacitors, varactors, and even semiconductors, can be located within the chamber as well, if their temperatures are to be controlled as well. A heat source provides thermal energy to the enclosure, and the devices within it, including the piezoelectric device. A circuit board, on which might be located active semiconductor devices as well as other passive devices, any of which might be heat sensitive, includes a plurality of perforations in the board, the locations of which define an area in which the heated enclosure including the piezoelectric device are located. These other devices beyond the perforations might include oven control circuit components but might also be unrelated to the OCO, perhaps being other constituents of other radio circuits. The perforations thermally isolate the OCO from the rest of the circuit board and other circuitry on it, reducing undesirable heat transfer from the heat source means to the circuit board beyond the perforations as well to other devices thereby more effectively confining the heat energy supplied to the OCO. The perforations effectively reduce the heat sink effect of a circuit board reducing the heat transfer from the enclosure through other components.

DESCRIPTION OF A PREFERRED EMBODIMENT

Figure 1:
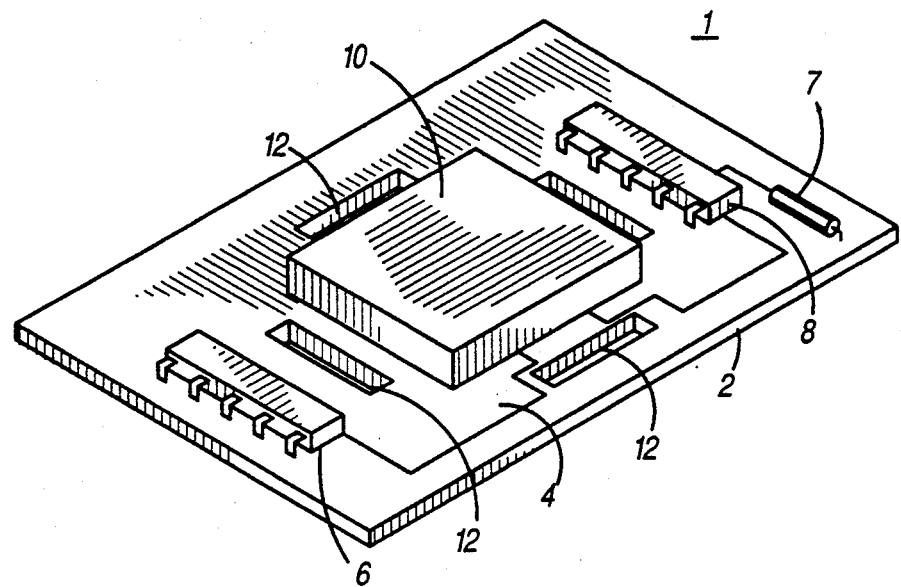
FIG. 1 shows a perspective view of a circuit board and an OCO thermally isolated by perforations in the circuit board.

FIG. 1 shows a perspective view of a circuit board that might be used for example in a two-way radio for example, that includes a thermally isolated, ovenized crystal oscillator (OCO) (10). The circuit board (2), typically comprises any well known circuit board material such as G-10 for instance. There may be several devices of various types and functions mounted on the circuit board (2), such as integrated circuits (6 and 8) as well as any type of passive component (7). Various conductive patterns on the surface of the circuit board (2) (as well as in, or on intermediate layers of the circuit board that are not shown in FIG. 1) interconnect the various components.

It is well known in the art that a high-temperature source of heat, such as a ovenized crystal oscillator (10), mounted on the circuit board (2) can significantly heat the other devices (6, 7, and 8) by means of the heat transfer occurring through the circuit board material itself, adversely affecting at least the reliability of the circuit embodied on the board (2). Heat transfered out of an OCO must be replaced, increasing the requirements of a power supply for the OCO. Additionally large thermal gradients caused by excessive heat loss across the OCO degrade the frequency stability of the OCO as well. Thermal isolation of an OCO (10) mounted on the circuit board (2) shown in FIG. 1 is accomplished by means of a plurality of perforations (12), which perforations in the preferred embodiment extend completely through the thickness of the circuit board (2), and which perforations surround or define an area (4) on the surface of the circuit board in which the OCO is located. These perforations (12) substantially thermally isolate the OCO from sections of the circuit board beyond, or external to, the area (4) defined by the perforations (12). In thermally isolating the OCO from the heat-sinking circuit board, the amount of input power to the OCO required to maintain its temperature can be substantially reduced, and thermal gradients across the OCO can be reduced as well. In addition, the time it takes for the OCO to stabilize its temperature is also reduced. While the perforations preferably extend completely through the board, alternate embodiments would include perforations (12) that do not extend completely through the board.

Thermal isolation of the OCO (10) from the heat-sinking circuit board and the other components (6, 7, and 8) will be affected by both the number and the dimensions of the perforations (12). As the cross-sectional area of the circuit board material left between the perforations decreases, the material through which heat from the OCO can be conducted through the board (2) and to components (6, 7, and 8) beyond the perforations will decrease, reducing heat conduction from the OCO to surrounding areas of the circuit board (2).

Figure 2:
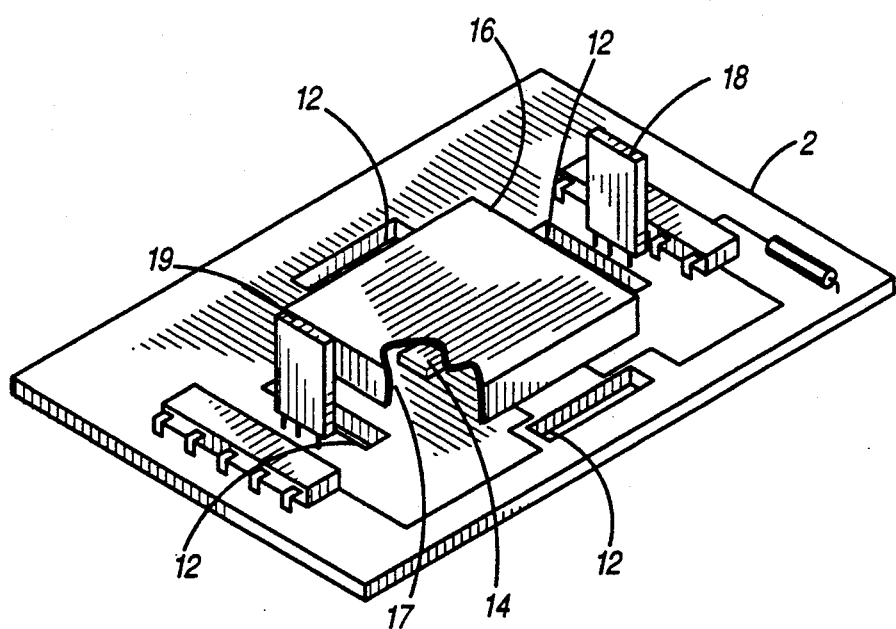
FIG. 2 shows a perspective view of the internal structure of the OCO shown in FIG. 1.

FIG. 2 shows a more detailed perspective view of the OCO (10) shown in FIG. 1. Note that in FIG. 2, the perforations (12) are positioned to mate with a particular geometry of the enclosure (16) of the OCO (10). The enclosure (16), which in the preferred embodiment was aluminum, substantially encloses a volume (19) in which is located a piezoelectric quartz crystal (14). Other, heat conductive but non-metallic materials might be used for the enclosure (16) as well. Also enclosed within this volume (19) is a temperature sensing means (17) for measuring the temperature inside the enclosure. It is preferable that this temperature sensing means (17) be located as close as possible to the piezoelectric device (14) including possibly being physically attached to it in order to more accurately measure the temperature of the piezoelectric device (14). Other active and/or passive components might be mounted within the enclosure (16) if such components require temperature stabilization. Such other components, which are not shown in FIG. 2 for clarity, are typically used in a crystal oscillator circuit and might include inductors, capacitors, resistors, varactors, and even semiconductors. In the preferred embodiment the temperature sensing means for measuring the temperature inside the enclosure was a thermistor, but also might include a temperature sensing semiconductor as well.

The piezoelectric device is typically a quartz crystal, the temperature-frequency characteristics of which are known in advance. The enclosure, as shown in FIG. 2, might not completely enclose the volume (19) but by means of openings in its surfaces substantially encloses a volume in which the piezoelectric device (14) is located. Alternate enclosures might completely enclose the piezoelectric device.

The heat source means in the preferred embodiment was a power transistor (18) the dissipation of which is controlled, at least in part, by the temperature as measured by the temperature sensing means (17). This transistor heat source means (18) supplies thermal energy to the enclosure (16) by being thermally coupled to the enclosure (16) so that heat produced within the transistor (18) is conducted into the interior or the enclosed volume (19). In the preferred embodiment, a thermally conductive, but electrically non-conductive thermal pad was used between the power transistor (18) and the enclosure (16) but alternate embodiments might use ungrounded enclosures (16) precluding the need for any insulator between the transistor (16) and enclosure (17). Those skilled in the art will recognize that the heat source means of claim 1 might also include, for example, a length of resistive wire, or a large high wattage resistor itself.

It should be apparent that using the above-identified structure, an OCO, which ordinarily generates significant amounts of heat energy, which heat requires significant amounts of electrical power to generate, is also often detrimental to the proper operation of other circuit components, can be directly mounted on to a circuit board that carries heat-sensitive components. When using the above-described OCO on a large circuit board, less electrical power is required than prior art OCOs to maintain the OCO's temperature, it takes less time for the OCO's temperature to stabilize, a separate, isolated OCO circuit board is unnecessary, thermal gradients in the OCO are reduced, and other temperature sensitive components are less significantly heated. While heat for the OCO can be isolated by the perforations, electrical signals can be carried into the OCO (10) and out away from the OCO by means of conductive traces that run between the perforations (12), as depicted in FIG. 1, including the use of discrete wires that bridge the perforations, if desired.

What is claimed is:

1. A temperature controlled ovenized crystal oscillator comprising:
   a piezoelectric device;
   an enclosure comprised of a heat conductive material substantially enclosing a volume in which said piezoelectric device is located;
   a transistor for supplying thermal energy to said enclosure, said transistor thermally coupled to the enclosure; and
   a circuit board having a plurality of perforations the locations of which define an area in which said enclosure and said transistor and said piezoelectric device are exclusively located, said perforations substantially thermally isolating said enclosure from sections of said circuit board beyond said perforations.

2. A temperature controlled ovenized crystal oscillator for mounting to a printed circuit board comprising:
   a piezoelectric device;
   a metallic enclosure substantially enclosing a volume in which said piezoelectric device is located;
   a transistor coupled to said metallic enclosure supplying thermal energy to said enclosure;
   a thermistor sensing the temperature within said enclosure; and
   a circuit board having a plurality of perforations the locations of which define an area in which said enclosure and said transistor, said thermistor and said piezoelectric device are exclusively located, said perforations extending through said circuit board and substantially thermally isolating said enclosure from sections of said circuit board beyond said perforations.

3. A temperature controlled ovenized crystal oscillator for mounting to a printed circuit board comprising:
   a piezoelectric device;
   a plurality of active and passive electronic components;
   a metallic enclosure substantially enclosing a volume in which said piezoelectric device and said active and passive electronic components are located;
   a transistor coupled to said metallic enclosure supplying thermal energy to said enclosure;
   a thermistor sensing the temperature within said enclosure; and
   a circuit board having a plurality of perforations the locations of which define an area in which said enclosure and said transistor, and said piezoelectric device and said thermistor are exclusively located, said perforations extending through said circuit board and substantially thermally isolating said enclosure from sections of said circuit board beyond said perforations.

4. A temperature controlled ovenized crystal oscillator comprising:
   a piezoelectric device;
   an enclosure comprised of a heat conductive material substantially enclosing a volume in which said piezoelectric device is located;
   a heat source means for supplying thermal energy to said enclosure, said heat source means thermally coupled to the enclosure; and
   a semiconductor device for measuring the temperature inside the enclosure;
   a circuit board having a plurality of perforations the locations of which define an area in which said enclosure and said heat source means, and said semiconductor for measuring the temperature, and said piezoelectric device are exclusively located, said perforations substantially thermally isolating said enclosure from sections of said circuit board beyond said perforations.

* * * * *